United States Patent
Kuo et al.

(10) Patent No.: US 8,445,348 B1
(45) Date of Patent: May 21, 2013

(54) MANUFACTURING METHOD OF A SEMICONDUCTOR COMPONENT WITH A NANOWIRE CHANNEL

(75) Inventors: Po-Yi Kuo, Pingtung County (TW); Tien-Sheng Chao, Hsinchu (TW); Yi-Hsien Lu, Yunlin County (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/432,011

(22) Filed: Mar. 28, 2012

(30) Foreign Application Priority Data

Dec. 28, 2011 (TW) .............................. 100149225 A

(51) Int. Cl.
*H01L 21/336* (2006.01)
(52) U.S. Cl.
USPC ........... 438/283; 438/284; 257/287; 977/936; 977/938
(58) Field of Classification Search
USPC ................... 438/284; 257/287; 977/936, 938
See application file for complete search history.

(56) References Cited

U.S. PATENT DOCUMENTS

| | | | |
|---|---|---|---|
| 2006/0014336 A1* | 1/2006 | Meng Lee et al. | 438/157 |
| 2006/0091481 A1* | 5/2006 | Li et al. | 257/401 |
| 2008/0017934 A1* | 1/2008 | Kim et al. | 257/401 |
| 2009/0121271 A1* | 5/2009 | Son et al. | 257/315 |
| 2010/0308391 A1* | 12/2010 | Kim et al. | 257/314 |

\* cited by examiner

*Primary Examiner* — Daniel Whalen
(74) *Attorney, Agent, or Firm* — Bacon & Thomas, PLLC

(57) ABSTRACT

The present invention discloses a manufacturing method of a semiconductor component with a nanowire channel. The method comprises the following steps. The step of forming a stack structure on a substrate is performed. A semiconductor layer is formed on the substrate and the stack structure and further filled into the fillister. The semiconductor layer is patterned to form a source area and a drain area, and the channel region is located between the source area and the drain area. The semiconductor layer located outside the source area, the drain area and the fillister will be removed. And then, the stack structure is then removed. Therefore, the semiconductor layer filled inside the fillister will be exposed to be as a channel. A gate oxide layer is formed to cover the channel, and a gate layer is then formed on the gate oxide layer.

19 Claims, 15 Drawing Sheets

MANUFACTURING METHOD OF A SEMICONDUCTOR COMPONENT WITH A NANOWIRE CHANNEL

BACKGROUND OF THE INVENTION

1. Field of the Invention

The present invention discloses a manufacturing method of a semiconductor component with a nanowire channel, particularly a manufacturing method of a junction or junctionless semiconductor component with a nanowire channel below 10 nm made by different materials having high etching selectivity.

2. Description of the Prior Art

The Metal-Oxide-Semiconductor Field-Effect Transistor is a component often used in very large integrated circuit, particularly its existence is often found on commercial integrated circuit chip product. As for the trend of quicker circuit computing speed, higher circuit density, more complicated chip function, and lower production cost, the gate length of Metal-Oxide-Semiconductor Field-Effect Transistor should also be reduced continuously. When the gate length is reduced to sub 20 nm, the interference among the source and drain and channel will be increased to influence the channel potential. Thus, as for short gate transistor, it is usually unable to control the open or close of channel accurately. The decrease for gate control ability of channel potential is also called the short channel effect.

There are a lot of methods to inhibit the short channel effect, such as increasing the doping concentration of substrate, reducing the thickness of gate layer, or reducing the depth of junction etc. However, as for sub 20 nm component process, there is practical difficulty for the above-mentioned methods. Thus, another control structure with better short channel effect is applied for smaller and smaller transistor component.

Improving the three-dimensional control ability of gate to channel and structure of microchannel dimension will provide better control of short channel effect, which is a covering type gate structure, such as the surrounding type gate or winding gate type transistor structure. As for the covering type gate structure, there is a gate with surrounding or covering channel. Compared to the other conventional basic structure, double gate type structure, and triple gate type structure, this type of structure will be able to improve the capacitance coupling between the gate and the channel more effectively. Thus, the surrounding gate component structure has become the development index of component in the future, and the manufacturing of nanowire channel has become the key of the gate component process.

However, as for the manufacturing method of semiconductor component with polycrystalline silicon nanowire, there are problems of uneven dimension, asymmetrical appearance or rough surface. Thus, some treatments will be applied in the process, such as the plasma treatment on hydrogen related surface etc. However, after these treatments, the electric reliability problem will be generated. It means that it is difficult to satisfy the channel with thick source/drain and nanodimension in present process for the surrounding gate component.

SUMMARY OF THE INVENTION

According to the above-mentioned description, one purpose of the present invention is to provide a manufacturing method of a semiconductor component with a nanowire channel. The method comprises at least the following steps. The step for forming a stack structure on a substrate is performed first. The stack structure at least comprises a first Tetraethoxysilane (or Tetraethyl orthosilicate) layer, i.e., TEOS layer, a first intermediate material layer and a second TEOS layer from bottom to top. The stack structure is then patterned to form a channel region. The step of partially removing the first intermediate material layer inside the channel region is performed to form at least a fillister on one side of the stack structure. A semiconductor layer is formed on the substrate and the stack structure and further filled into the fillister. The semiconductor layer is patterned to form a source area and a drain area, and the channel region is located between the source area and the drain area. The semiconductor layer located outside the source area, the drain area and the fillister will be removed. And then, the stack structure is then removed. Therefore, the semiconductor layer filled inside the fillister will be exposed to be as a channel. A gate oxide layer is formed to cover the channel, and a gate layer is then formed on the gate oxide layer.

In an embodiment of the present invention, the steps of removing the stack structure further comprises the following steps. Firstly, removing the first TEOS layer and the second TEOS layer is carried out, then removing the first intermediate material layer.

In an embodiment of the present invention, as for the step of removing the first TEOS layer and the second TEOS layer, there is an etching selectivity for the first TEOS layer, the second TEOS layer, the first intermediate material layer, the substrate and the semiconductor layer, and the preferred etching selectivity is 10000: 10000: 1: 1: 1.

In an embodiment of the present invention, as for the step of removing the first intermediate material layer, there is an etching selectivity for the first TEOS layer, the second TEOS layer, the first intermediate material layer, the substrate and the semiconductor layer, and the preferred etching selectivity is 1: 1: 10000: 1: 1.

In an embodiment of the present invention, the thickness of the first TEOS layer, the first intermediate material layer and the second TEOS layer is 50 nm, 10 nm and 50 nm, respectively.

In an embodiment of the present invention, the channel diameter is smaller than or equal to 10 nm.

In an embodiment of the present invention, the substrate comprises the silicon nitride or silicon rich nitride, and the first intermediate material layer comprises the polycrystalline germanium, germanium oxide or silicon nitride.

In an embodiment of the present invention, the semiconductor layer includes the non-doping amorphous silicon, high concentration doping amorphous silicon, amorphous germanium, polycrystalline germanium, silicon germanium compound, Group III & V compound or metal oxide.

In an embodiment of the present invention, the step of forming the semiconductor layer on the substrate and the stack structure and further filled into the fillister comprises the chemical vapor deposition, plasma reinforced chemical vapor deposition, high density plasma chemical vapor deposition, ultra high vacuum chemical vapor deposition or molecular beam epitaxy.

In an embodiment of the present invention, when the semiconductor layer comprises the non-doping amorphous silicon, after forming the semiconductor layer on the substrate and the stack structure and further filled into the fillister, the step further comprises executing the crystallization process to convert the amorphous silicon covered by the semiconductor layer into the polycrystalline silicon. Preferable, the above-mentioned crystallization process comprises solid-state crystallization process and laser annealing crystallization process.

In an embodiment of the present invention, further comprises performing an ion implantation process to semiconductor layer of the source area and drain area.

In an embodiment of the present invention, when the semiconductor layer comprises high concentration doping amorphous silicon, upon forming the gate oxide layer to cover the channel, the step further comprises activating the amorphous silicon of channel to convert it into the polycrystalline silicon. At this time, the semiconductor component is the junctionless semiconductor component.

In an embodiment of the present invention, the stack structure further comprises a second intermediate material layer and a third TEOS layer. The second intermediate material layer is formed on the second TEOS layer. The third TEOS layer is formed on the second intermediate material layer. At this time, upon partially removing the first intermediate material layer to form a fillister on one side of the stack structure, the step further comprises partially removing the second intermediate material layer inside the channel region to form a plurality of fillisters on one side of the stack structure. After removing the stack structure, the semiconductor component then comprises a plurality of subject channels.

In an embodiment of the present invention, the wet etching is employed to partially remove the first intermediate material layer inside the channel region to form a fillister on one side of the stack structure. The etching solution of wet etching can be selected from the hydrogen peroxide solution and hot phosphoric acid solution.

In an embodiment of the present invention, the wet etching is employed to partially remove the stack structure. The etching solution of wet etching can be selected from hydrogen fluoride solution, hot phosphoric acid solution, and hydrogen peroxide solution.

In an embodiment of the present invention, the anisotropic dry etching with high selectivity is employed to remove the semiconductor layer located outside the source area, the drain area and the fillister. In an embodiment of the present invention, the steps of forming a stack structure on the substrate comprise: A first TEOS layer is formed on a substrate first. Then, a first intermediate material layer is formed on the first TEOS layer. Finally, a second TEOS layer is formed on the first intermediate material layer. The vapor deposition process can be employed to form the first TEOS layer, the first intermediate material layer and the second TEOS layer on the substrate. Preferably, the above-mentioned vapor deposition process may be the chemical vapor deposition or the physical vapor deposition. The chemical vapor deposition may be the low-pressure chemical vapor deposition, the plasma enhances chemical vapor deposition, the high density plasma chemical vapor deposition or the ultra high vacuum chemical vapor deposition. The physical vapor deposition may be the resistance heating vapor deposition, the electronic gun vapor deposition or sputtering vapor deposition.

Another purpose of the present invention is to provide a semiconductor component manufactured by the above-mentioned method. This semiconductor component at least comprises a substrate, a plurality of stack structure, a source, a drain, a channel, a gate oxide layer and a gate layer. The plurality of stack structure is formed on the substrate, which comprises a first TEOS layer, a first intermediate material layer and a second TEOS layer from bottom to top. The source and drain are formed on the substrate and part of stack structure, respectively. The both ends of channel are connected to the source and drain. The gate oxide layer is covered on the channel, and the gate layer is covered on the gate oxide layer.

Therefore, the advantage and spirit of the present invention can be understood further by the following detail description of invention and attached figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
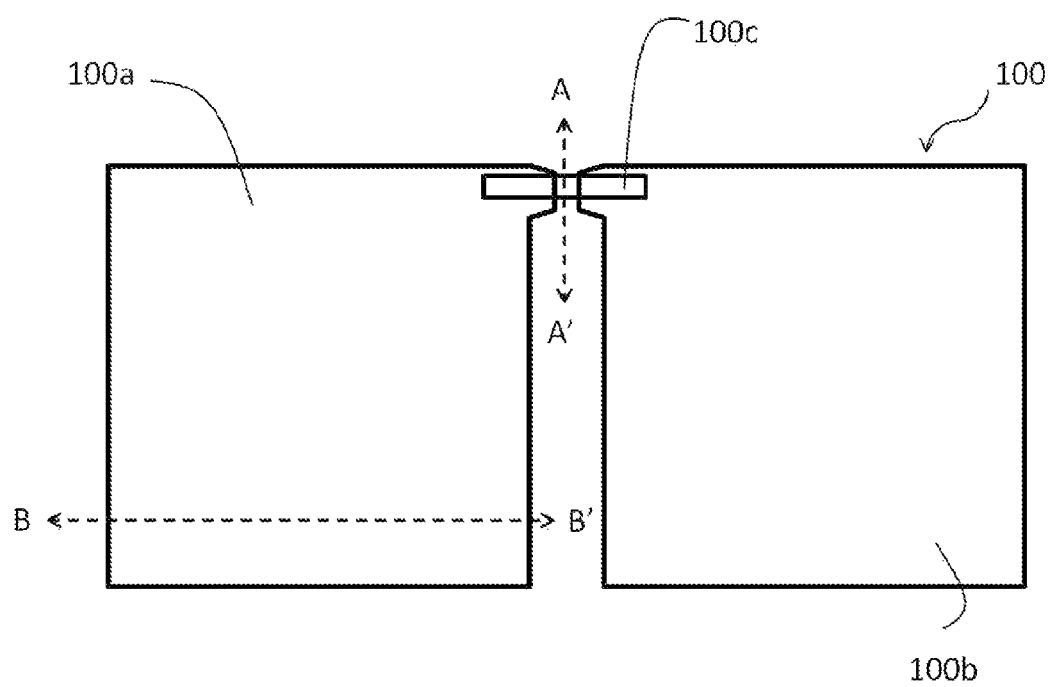
FIG. 1A to FIG. 1C show the mask layout for manufacturing the semiconductor component in a preferred embodiment of the present invention.
Figure 1B:
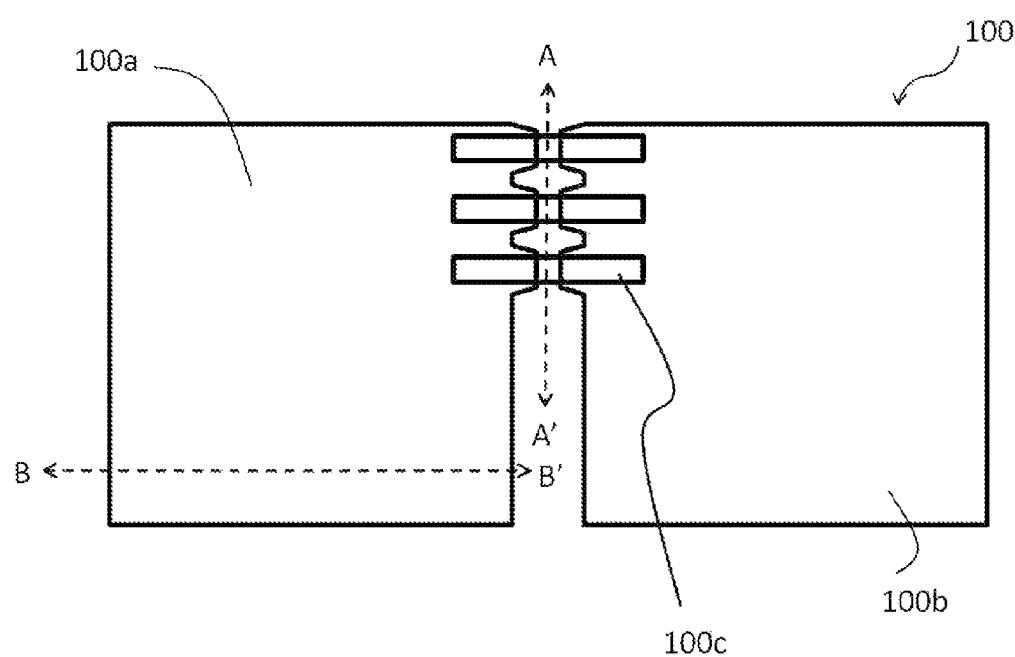
Figure 1C:
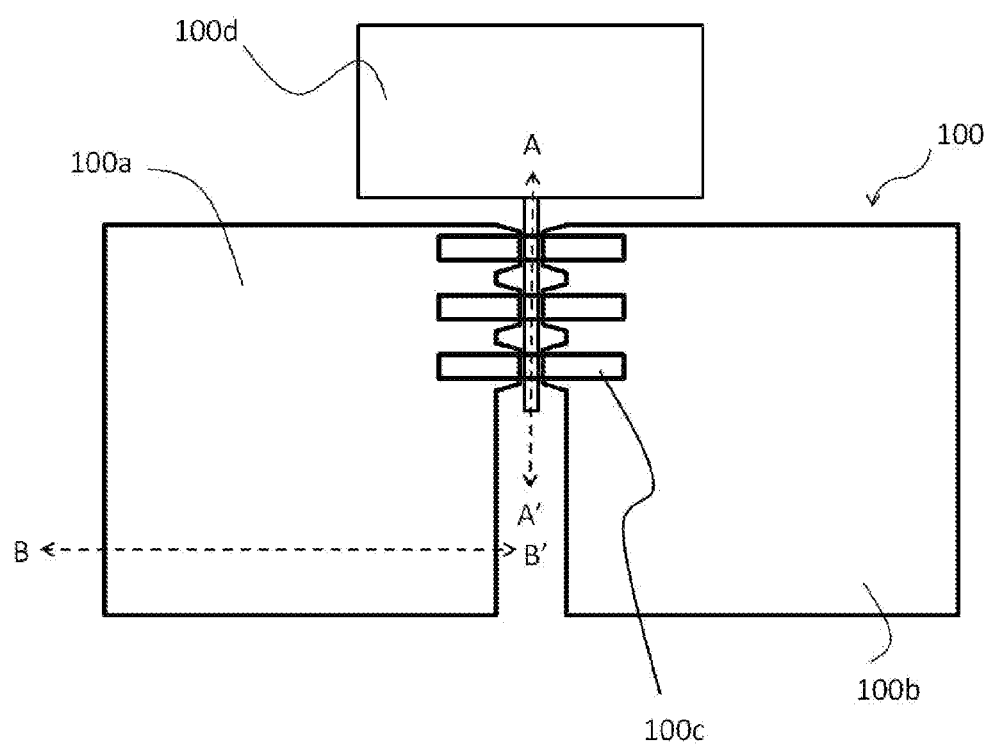
Figure 2A:
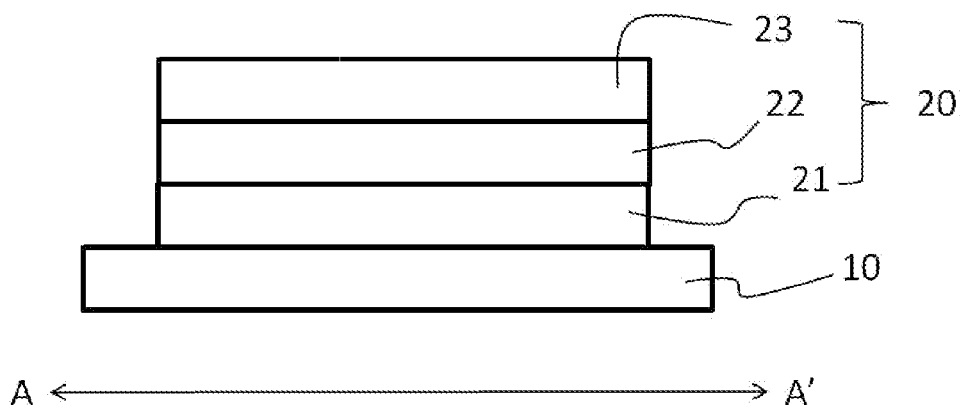
FIG. 2A to FIG. 2G show the flow chart of a semiconductor manufacturing process in first embodiment of the present invention.

Please refer to FIG. 1A to FIG. 1C. FIG. 1A to FIG. 1C show the mask for manufacturing the semiconductor component in a preferred embodiment of the present invention. Firstly, as shown in FIG. 1A, the mask layout 100c provided by the present invention can be used to define a channel region. The mask 100a and mask 100b are used to define the source/drain in source area and drain area, respectively. The manufacturing process of semiconductor component provided by the present invention will be described by the side view of A-A' line and B-B' line in FIG. 1A to FIG. 1C. In addition, in FIG. 1A to FIG. 1C, the trapezoid design is used to reduce the overlap area of source/drain area and gate, in order to improve the off current of component. Then, please refer to FIG. 2A to FIG. 2G. FIG. 2A to FIG. 2G show the flow chart of a semiconductor manufacturing process in first embodiment of the present invention. Firstly, as shown in FIG. 2A, a stack structure 20 is formed on the substrate 10. The stack structure 20 comprises at least a first TEOS layer 21, a first intermediate material layer 22 and a second TEOS layer 23 from bottom to top. Basically, the steps of forming a stack structure on a substrate 10 are described as followings. A first TEOS layer 21 is formed on the substrate 10 firstly. A first intermediate material layer 22 is formed on the first TEOS layer 21 then. Finally, a second TEOS layer 23 is formed on the first intermediate material layer 22. The first TEOS layer 21 or the second TEOS layer 23 may be any form of silicon oxide or silicon dioxide, which is not limited in the present invention. In addition, the above-mentioned steps may be finished by the vapor deposition process. Preferably, the vapor deposition process may be the chemical vapor deposition or the physical vapor deposition. The chemical vapor deposition may be the low-pressure chemical vapor deposition, the plasma enhances chemical vapor deposition, the high density plasma chemical vapor deposition or the ultra high vacuum chemical vapor deposition. The physical vapor deposition may be the resistance heating vapor deposition, the electronic gun vapor deposition or sputtering vapor deposition.

In the first embodiment, the substrate 10 comprises the silicon nitride. The first intermediate material layer 22 comprises the polycrystalline germanium or germanium oxide. Preferably, the thickness of first TEOS layer 21, first intermediate material layer 22 and second TEOS layer 23 is 50 nm, 10 nm and 50 nm, respectively.

Figure 2B:
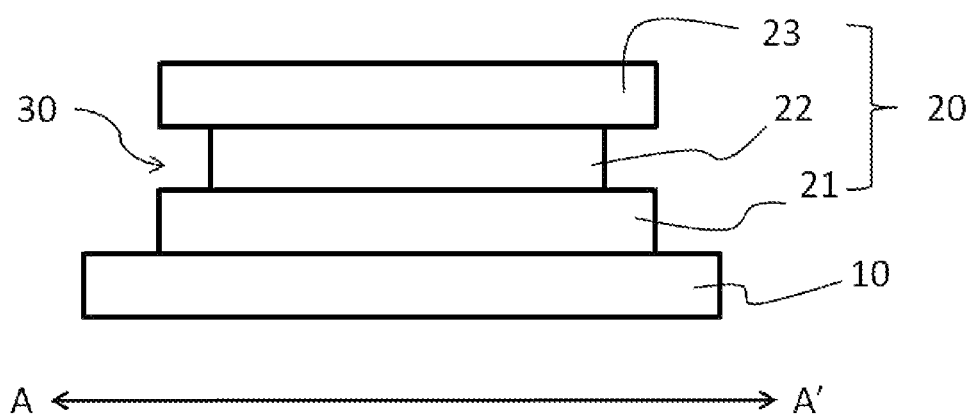

FIG. 2A shows that the side view of A-A' line which is shown in FIG. 1A. As shown in FIG. 1A, the mask 100c can be used to define a stack structure 20 on the channel region. Then the anisotropic dry etching is used to etch the second TEOS layer 23, first intermediate material layer 22 and first TEOS layer 21 downwards to form the stack structure 20 in the channel region shown in FIG. 2A. Then, as shown in FIG. 2B, the wet etching is used to partially remove the first intermediate material layer 22 inside the channel region to form the fillister 30 on both sides of the stack structure 20. In a preferred embodiment, the wet etching process is achieved by using the high temperature diluted hydrogen peroxide solution to partially remove the first intermediate material layer 22 comprising the polycrystalline germanium or germanium oxide.

Figure 2C:
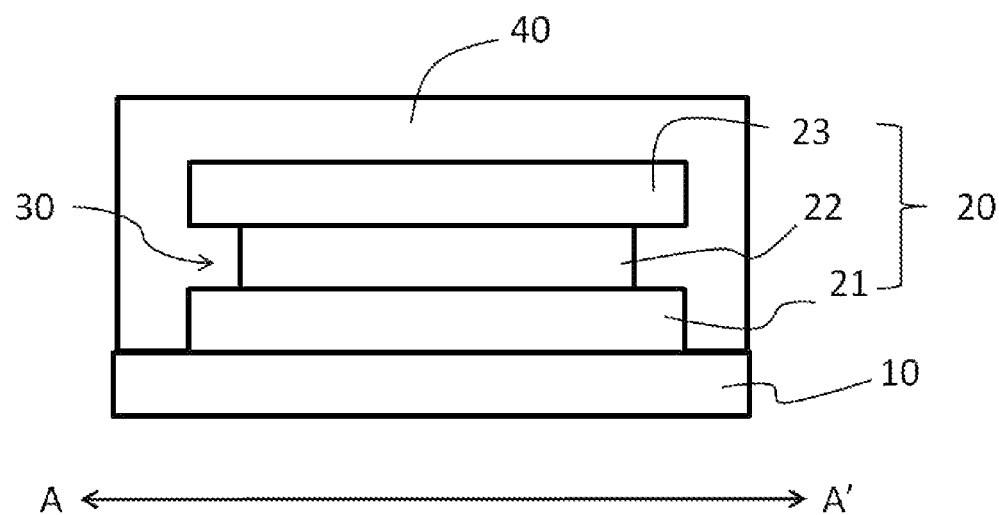

Then, as shown in FIG. 2C, a semiconductor layer 40 is formed on the substrate 10 and stack structure 20 filled into the fillister 30. This step may be finished by the low-pressure chemical vapor deposition, plasma reinforced chemical vapor deposition, high density plasma chemical vapor deposition, ultra high vacuum chemical vapor deposition or molecular beam epitaxy.

The semiconductor layer 40 comprises the non-doping amorphous silicon, high concentration doping amorphous silicon, amorphous germanium, polycrystalline germanium, silicon germanium compound, Group III & V compound or metal oxide. When the semiconductor layer 40 is the non-doping amorphous silicon, after forming the semiconductor layer 40 on the substrate 10 and the stack structure 30 and further filled into the fillister 30, the step further comprises executing the crystallization process to convert the amorphous silicon covered by the semiconductor layer into the polycrystalline silicon. Basically, the above-mentioned crystallization process may be the solid phase crystallization process, which is performed at 600° C. for 24 hours. However, the process temperature and time may be adjusted in accordance with different materials, which is not limited in the present invention. In addition, the crystallization process comprises the other crystallization process, such as the laser annealing crystallization process etc. The ion implantation process can be employed for the high concentration doping source area and drain area. At this time, the semiconductor component is the traditional junction semiconductor component.

In addition, if the semiconductor layer 40 is high concentration doping amorphous silicon, the above-mentioned crystallization process can be omitted. The amorphous silicon can be converted to the polycrystalline silicon after the gate oxide layer is formed in the channel. At this time, the semiconductor component is the junctionless semiconductor component. Furthermore, the manufacturing cost can be reduced and the process can be applied in the three-dimensional integrated circuit.

Figure 2D:
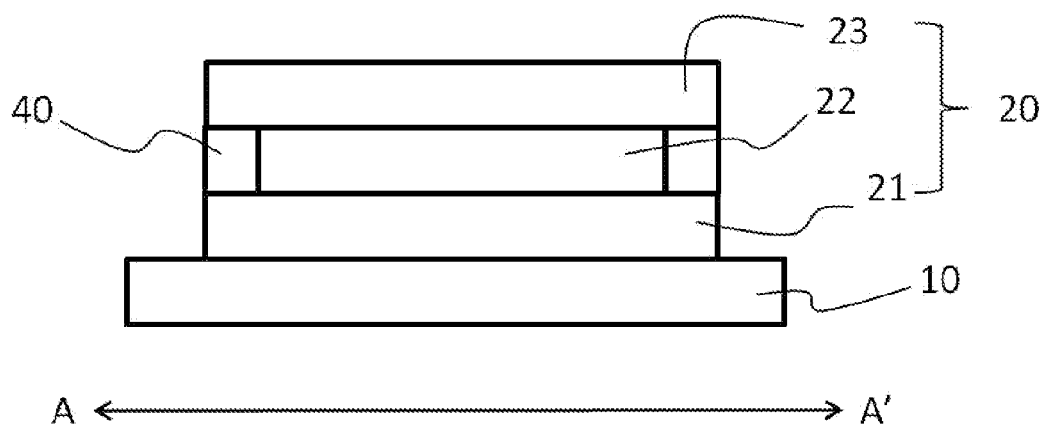

Then, as shown in FIG. 1A, the mask 100a and mask 100b are used to define the source area and drain area on the semiconductor layer 40. The channel region is located between the source area and the drain area with partial overlap. It is to say that the distance between the source area and the drain area is almost the length of nanowire channel. The anisotropic dry etching with high selectivity is employed to remove the semiconductor layer 40 located outside the source area, the drain area and the fillister. Basically, because part of semiconductor layer 40 has been filled into the fillister 30, so when the dry etching is used to remove the semiconductor layer 40 in channel region, the semiconductor layer 40 inside the fillister 30 will not be removed and inserted in the stack structure 20, as shown in FIG. 2D.

Figure 2E:
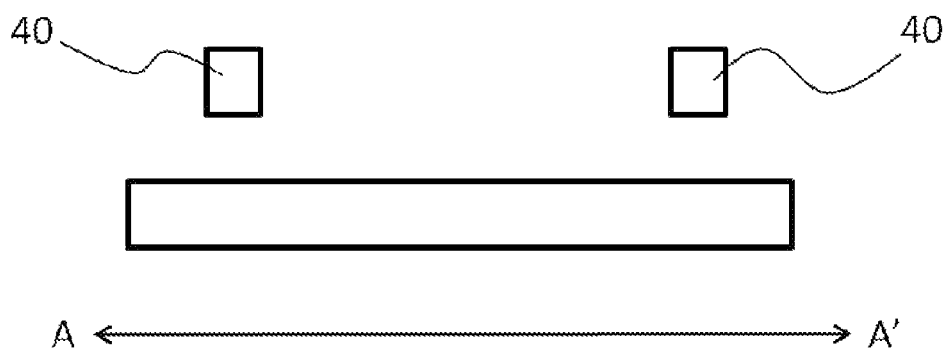

Please refer to FIG. 2E. The hydrogen fluoride is used as the etching solution in wet etching to remove the first TEOS layer 21 and the second TEOS layer 23. The high temperature diluted hydrogen peroxide solution is used as the etching solution in wet etching to remove the first intermediate material layer 22 including the polycrystalline germanium or germanium oxide. At this time, the semiconductor layer 40 in the fillister 30 forms two channels connected to the source area and the drain area.

It has to say that in this embodiment, the first TEOS layer 21, first intermediate material layer 22, second TEOS layer 23, substrate 10 and semiconductor layer 40 have high etching selectivity. Upon removing the first TEOS layer 21 and second TEOS layer 23 on the stack structure 20, the preferred etching selectivity is 10000: 10000: 1: 1 1. In addition, Upon removing the first intermediate material layer 22 (such as the material with germanium), the preferred etching selectivity is 1: 1: 10000: 1: 1.

In addition, please refer to FIG. 1B. The present invention can also add the mask 100c in channel region. That is to say when the mask 100c in channel region is the complex number, the formed stack structure 20 will also be the complex number, and the channels with nanodimension can exist with 2 multiple too naturally to achieve multiple channels at horizontal direction. For example, if there are three mask 100c in channel region, three stack structure 20 will be formed on the substrate 10, and six fillister 30 will be formed finally. In other words, if the number of mask is N, the number of channel at horizontal direction will be 2N.

In the semiconductor component process provided by the present invention, because the first TEOS layer 21 and the second TEOS layer 23 occupy most of stack structure, the hydrogen fluoride can be used to clean these two layers at ambient temperature. In addition, because the high temperature diluted hydrogen peroxide solution and the hydrogen fluoride will not etch the substrate 10 with silicon nitride and the semiconductor layer 40 in the fillister 30, the defects of conventional art such as over-etching of substrate under semiconductor layer in source/drain area, uneven dimension of nanowire channel, irregular shape or breakage problems, can be improved effectively. It means that the present invention can select different materials with high etching selectivity, such as the first TEOS layer 21, the first intermediate material layer 22, the second TEOS layer 23 and the substrate 10, to increase the yield of semiconductor component with nanowire channel. Furthermore, the diameter of nanowire channel manufactured by the present invention can be less than 10 nm.

In addition, as shown in FIG. 1A and FIG. 2E, both ends of suspended channel 40 (the semiconductor layer 40 inserted in fillister 30 originally) are connected to the source area and the drain area on the substrate 10, which will not be described again in the following description.

Figure 2F:
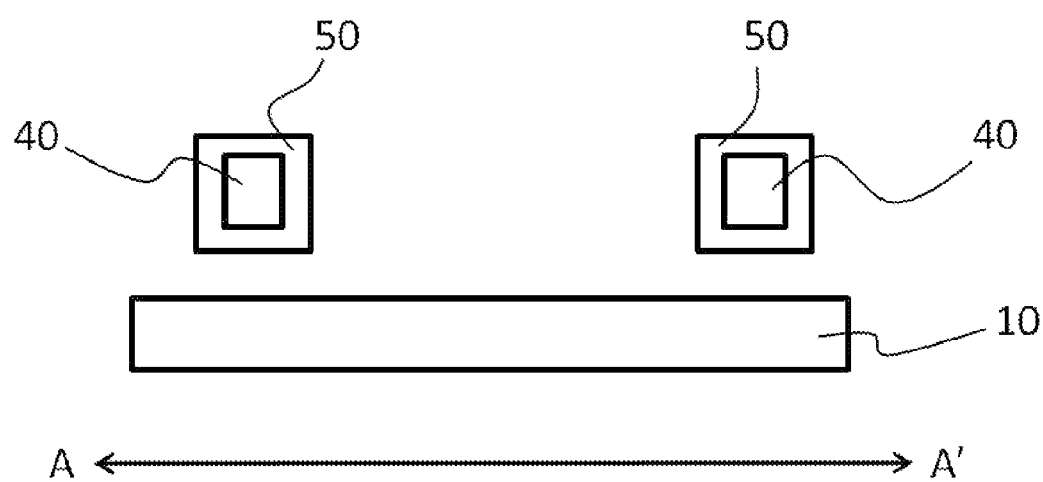
Figure 2G:
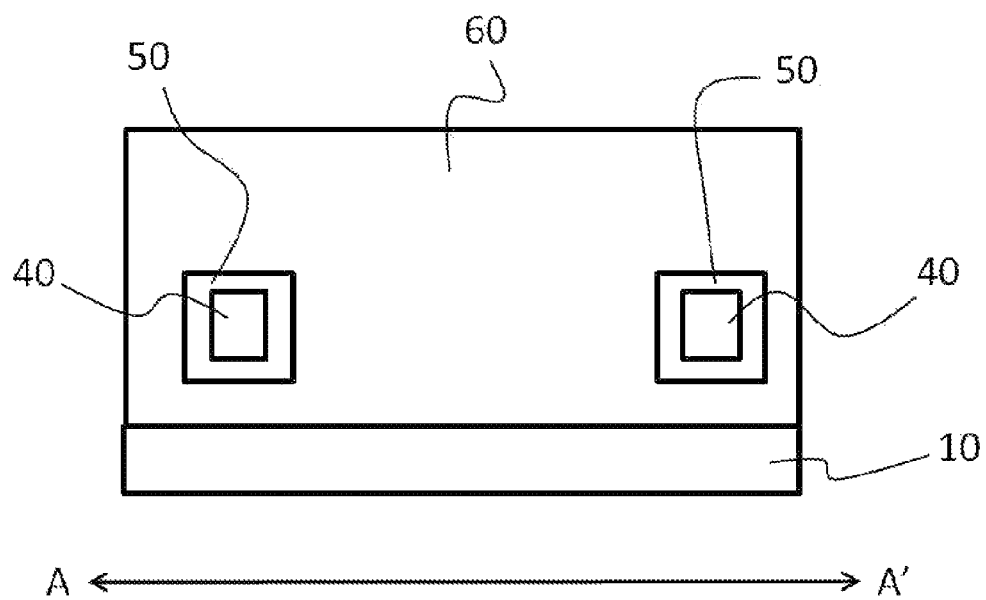

Then, after the channel 40 is covered by a gate oxide layer 50, a gate layer 60 in formed on the gate oxide layer 50, as shown in FIG. 2F and FIG. 2G. In a preferred embodiment, the above-mention two steps are finished by the low-pressure chemical vapor deposition. Finally, the mask 100d shown in FIG. 1C is used to define the gate. Preferably, the mask 100d shown in FIG. 1C will conclude the whole channel region, thus the width of mask 100d in the channel region will be equal to or slightly larger than the distance between the source area and the drain area.

Figure 3:
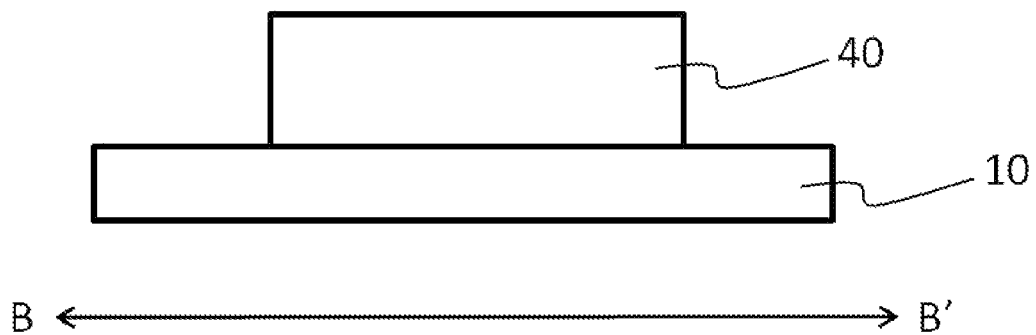
FIG. 3 shows the side view of B-B' line of semiconductor component for a preferred embodiment of the present invention.

Please refer to FIG. 3. FIG. 3 shows that the side view of B-B' line of semiconductor component for a preferred embodiment of the present invention. As shown in FIG. 3, the semiconductor layer 40 in the source area and the drain area is formed on the substrate 10. Preferably, the source and drain are raised source/drain.

The structure and process of semiconductor component described in the second embodiment are almost similar to the first embodiment of the present invention. The only difference is that the substrate 10 comprises a silicon rich nitride, and the first intermediate material layer 22 comprises a silicon nitride in the second embodiment.

As shown in FIG. 2B, due to different material is used for the first intermediate material layer 22, the hot phosphoric acid solution is used as the etching solution of wet etching to partially remove the silicon nitride in the first intermediate material layer 22 to form the fillister 30 on both sides of stack structure 20 in the channel region. Similarly, in the following process, the hydrogen fluoride is used to partially remove the first TEOS layer 21 and second TEOS layer 23 of stack structure 20 in the channel region, and the hot phosphoric acid solution is used to partially remove the first intermediate material layer 22.

In the second embodiment, because the first intermediate material layer 22 shares small ratio and the hot phosphoric acid solution has high etching selectivity to the silicon nitride included in the first intermediate material layer 22 and the silicon rich nitride included in the substrate 10, the etching time will be shorter and the problems of conventional art will be eliminated.

Figure 4A:
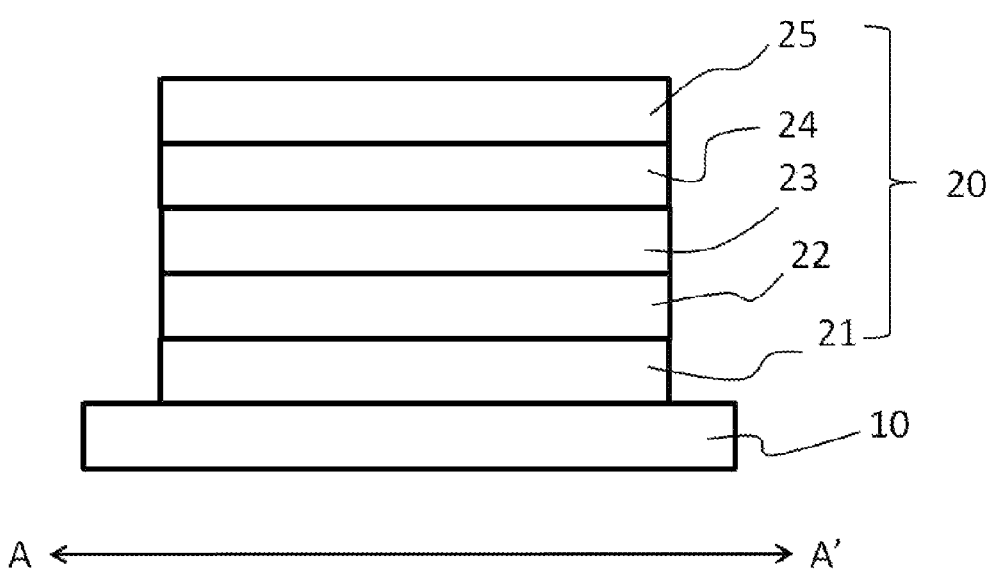
FIG. 4A to FIG. 4D show the flow chart of a semiconductor manufacturing process in first embodiment of the present invention.
Figure 4B:
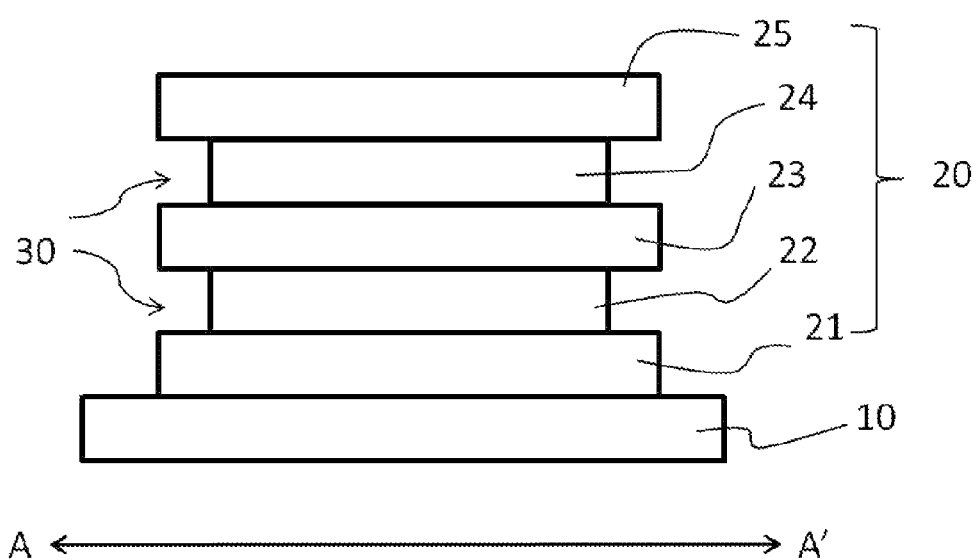
Figure 4C:
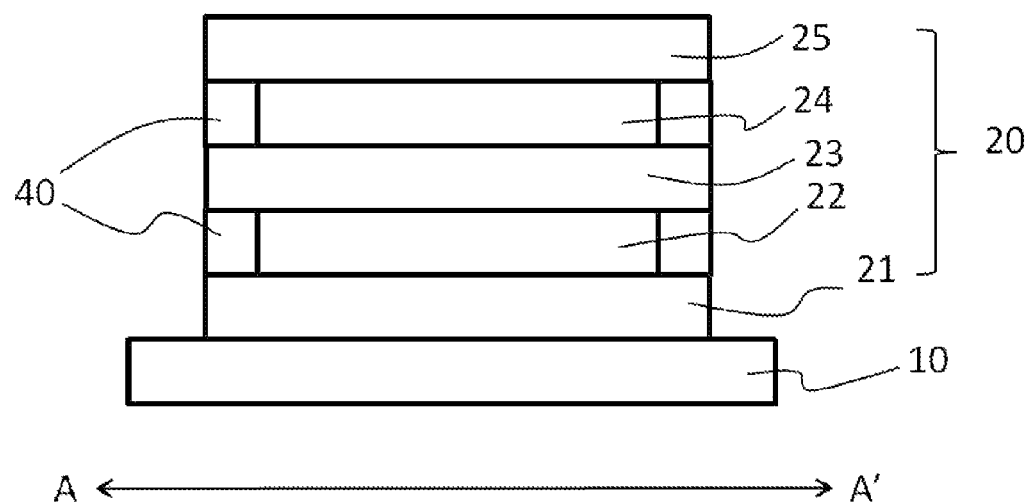

Please refer to FIG. 4A to FIG. 4C. FIG. 4A to FIG. 4C show a flow chart of the semiconductor manufacturing process for a third embodiment of the present invention. The main difference among the third embodiment and the other two embodiments is that the stack structure 20 further comprises a second intermediate material layer 24 and a third TEOS layer 25. The second intermediate material layer 24 is formed on the second TEOS layer 23 and the third TEOS layer 25 is formed on the second intermediate material layer 24. The mask 100c is also used to pattern the stack structure 20 instead of using the anisotropic dry etching to etch the third TEOS layer 25, the second intermediate material layer 24, the second TEOS layer 23, the first intermediate material layer 22 and the first TEOS layer 21 downwards. Finally, the stack structure 20 in channel region shown in FIG. 4A will be finished.

As shown in FIG. 4B, in the third embodiment, the step for removing the first intermediate material layer 22 to form the fillister 30 at both sides of the stack structure 20 also comprises partially removing the second intermediate material layer 24 in channel region to form four fillister 30 at both sides of the stack structure 20 shown in FIG. 4B.

Then, a semiconductor layer 40 is formed on the substrate 10 and stack structure 20 further filled into the fillister 30 (refer to FIG. 2C). The mask 100a and mask 100b are used to pattern the semiconductor layer 40. The anisotropic dry etching with high selectivity is employed to remove the semiconductor layer 40 located outside the source area, the drain area and the fillister. Basically, because part of semiconductor layer 40 has been filled into the fillister 30, so when the dry etching is used to remove the semiconductor layer 40 in channel region, the semiconductor layer 40 inside the fillister 30 will not be removed and inserted in the stack structure 20, as shown in FIG. 4C.

Similar to FIG. 2E, selecting suitable etching solution to partially remove the first TEOS layer 21, the second TEOS layer 23 and the third TEOS layer 25, the first intermediate material layer 22 and the second intermediate material layer 24. At this time, the semiconductor layer 40 inside the fillister 30 will form four suspended channels connected to the source area and the drain area.

Figure 4D:
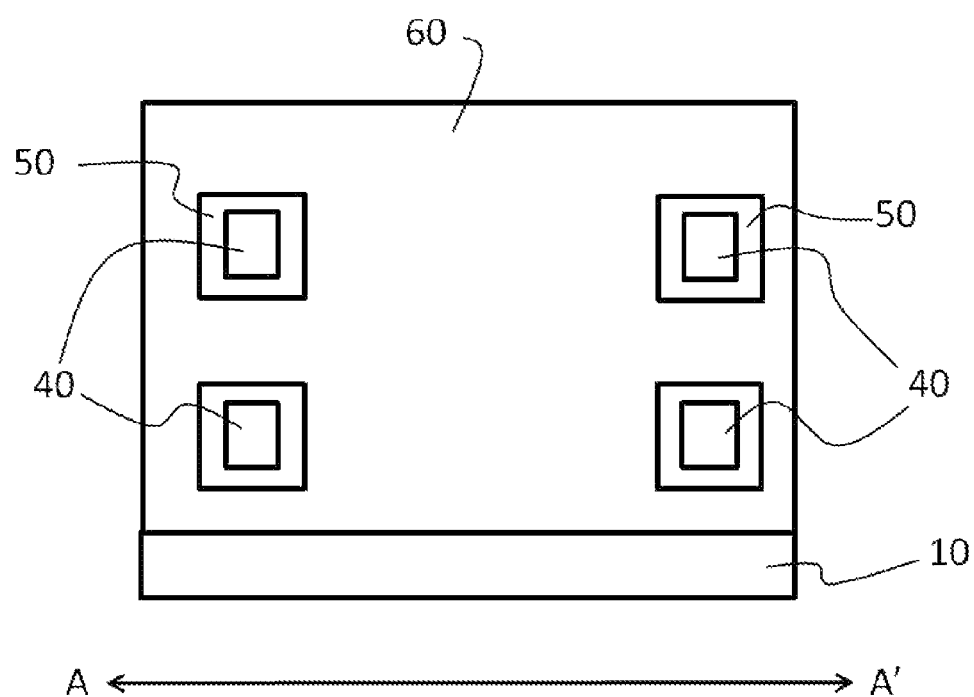

As shown in FIG. 4D finally, the low-pressure chemical vapor deposition is used to form a gate oxide layer 50 to cover the channels, and form a gate layer 60 on the gate oxide layer 50.

The method provided by the third embodiment of the present invention can increase many nanowire channels to raise the conductive current of component tremendously. In addition, the second intermediate material layer 24 in the third embodiment also comprises a polycrystalline germanium or a germanium oxide. Thus, it is able to refer the first embodiment for the selection of etching solution and the process steps.

In an embodiment of the present invention, the source and drain are raised source/drain. In a preferred embodiment, the source and drain are raised source/drain.

In a preferred embodiment, the material of gate layer may be the polycrystalline silicon, polycrystalline silicon germanium or metal gate material. The material of gate oxide layer may be the TEOS oxide, silicon dioxide or high dielectric material. In addition, the low-pressure chemical vapor deposition can be used to form the gate oxide layer and the gate layer. However, it is not limited in the present invention, the process for cover nanowire channel can be used.

In summary, in the process of semiconductor component with nanowire channel provided by the present invention, the materials with high etching selectivity can be used for the stack structure. The stack sequence and thickness are also designed to control the shape and size of nanowire through wet etching.

Thus, the present invention can increase the yield of semiconductor component with nanowire channel less than 10 nm, and improve the defects of conventional art such as over-etching of substrate under semiconductor layer in polycrystalline silicon source/drain area. It is able to reduce the leaking current of drain upon closing the component with nonideal gate, which will become more ideal for the manufacturing of field effect transistor with nanowire channel and surrounding gate and raised source/drain. Furthermore, in order to meet low-temperature process of three-dimensional integrated circuit (3D-IC) component, the chemical vapor deposition of physical vapor deposition can be used to deposit the above-mentioned materials, such as the silicon nitride in the substrate 10, stack structure 20, semiconductor layer 40, gate oxide layer 50 and gate layer 60. Finally, in the third embodiment of the present invention, the stack structure can be extended by several layers to obtain multiple nanowire channels for the application of three-dimensional component.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A manufacturing method of a semiconductor component with a nanowire channel, comprising:

forming a stack structure on a substrate, the stack structure at least comprising a first TEOS layer, a first intermediate material layer and a second TEOS layer from a bottom to a top;

patterning the stack structure to form a channel region;

removing the first intermediate material layer inside the channel region to form at least a fillister on one side of the stack structure;

forming a semiconductor layer on the substrate and the stack structure and filling into the fillister;

patterning the semiconductor layer to form a source area and a drain area, and the channel region being located between the source area and the drain area;

removing the semiconductor layer located outside the source area, the drain area and the fillister;

removing the stack structure to expose the semiconductor layer inside the fillister to form a channel;

forming a gate oxide layer to cover the channel; and forming a gate layer on the gate oxide layer.

2. The method according to claim 1, wherein the steps of removing the stack structure further comprises the following steps:

removing the first TEOS layer and the second TEOS layer; and removing the first intermediate material layer.

3. The method according to claim 2, wherein the step of removing the first TEOS layer and the second TEOS layer comprises an etching selectivity for the first TEOS layer, the second TEOS layer, the first intermediate material layer, the substrate and the semiconductor layer about 10000: 10000: 1: 1: 1.

4. The method according to claim 2, wherein the step of removing the first TEOS layer comprises an etching selectivity for the second TEOS layer, the first intermediate material layer, the substrate and the semiconductor layer about 1: 1: 10000: 1: 1.

5. The method according to claim 1, wherein the thickness of the first TEOS layer, the first intermediate material layer and the second TEOS layer is 50 nm, 10 nm and 50 nm, respectively.

6. The method according to claim 1, wherein the channel diameter is smaller than or equal to 10 nm.

7. The method according to claim 1, wherein the substrate is selected from the group consisting of the silicon nitride and silicon rich nitride, and the first intermediate material layer is selected from the group consisting of polycrystalline germanium, germanium oxide and silicon nitride.

8. The method according to claim 1, wherein the semiconductor layer is selected from the group consisting of non-doping amorphous silicon, high concentration doping amorphous silicon, amorphous germanium, polycrystalline germanium, silicon germanium compound, Group III & V compound and metal oxide.

9. The method according to claim 8, wherein the step of forming the semiconductor layer on the substrate and the stack structure and filled into the fillister is selected from the group consisting of chemical vapor deposition, plasma reinforced chemical vapor deposition, high density plasma chemical vapor deposition, ultra high vacuum chemical vapor deposition and molecular beam epitaxy.

10. The method according to claim 8, wherein when the semiconductor layer comprising the non-doping amorphous silicon and after forming the semiconductor layer on the substrate and the stack structure and filled into the fillister, the steps further comprises:

executing a crystallization process to convert the amorphous silicon covered by the semiconductor layer into a polycrystalline silicon; and executing an ion implantation process for the source area and drain area of the semiconductor layer.

11. The method according to claim 8, wherein when the semiconductor layer comprising high concentration doping amorphous silicon and upon forming the gate oxide layer to cover the channel, the steps further comprises:

activating an amorphous silicon of channel to convert it into a polycrystalline silicon, and the semiconductor component being a junctionless semiconductor component.

12. The method according to claim 1, wherein the stack structure further comprises:

a second intermediate material layer being formed on the second TEOS layer; and a third TEOS layer being formed on the second intermediate material layer.

13. The method according to claim 12, wherein upon partially removing the first intermediate material layer to form a fillister on one side of the stack structure, the steps further comprises:

removing the second intermediate material layer inside the channel region to form a plurality of fillisters on one side of the stack structure, after removing the stack structure, the semiconductor component comprising a plurality of subject channels.

14. The method according to claim 1, wherein removing the first intermediate material layer inside the channel region to form a fillister on one side of the stack structure comprises an wet etching, and the etching solution of the wet etching is selected from the group consisting of hydrogen peroxide solution and hot phosphoric acid solution.

15. The method according to claim 1, wherein removing the stack structure comprising wet etching, and etching solution of the wet etching is selected from the group consisting of hydrogen fluoride solution, hot phosphoric acid solution, and hydrogen peroxide solution.

16. The method according to claim 1, wherein removing the semiconductor layer located outside the source area, the drain area and the fillister comprises anisotropic dry etching with high selectivity.

17. The method according to claim 1, wherein the steps of forming a stack structure on the substrate comprises:

forming a first TEOS layer on the substrate;

forming a first intermediate material layer on the first TEOS layer; and forming a second TEOS layer on the first intermediate material layer.

18. The method according to claim 17, wherein the forming the first TEOS layer, the first intermediate material layer and the second TEOS layer on the substrate comprises vapor deposition process.

19. The method according to claim 18, wherein the vapor deposition process comprises chemical vapor deposition or the physical vapor deposition, the chemical vapor deposition is selected from the group consisting of low-pressure chemical vapor deposition, plasma enhances chemical vapor deposition, high density plasma chemical vapor deposition and ultra high vacuum chemical vapor deposition, the physical vapor deposition is selected from the group consisting of resistance heating vapor deposition, electronic gun vapor deposition and sputtering vapor deposition.

* * * * *